United States Patent [19]

Lebby et al.

[11] Patent Number: 5,249,245
[45] Date of Patent: Sep. 28, 1993

[54] OPTOELECTROINC MOUNT INCLUDING FLEXIBLE SUBSTRATE AND METHOD FOR MAKING SAME

[75] Inventors: Michael S. Lebby, Apache Junction, Ariz.; Thomas H. Blair, Schaumburg, Ill.

[73] Assignee: Motorola, Inc., Schaumburg, Ill.

[21] Appl. No.: 937,013

[22] Filed: Aug. 31, 1992

[51] Int. Cl.⁵ .................. G02B 6/12; H01L 21/70; B29D 11/00
[52] U.S. Cl. .......................... 385/89; 385/14; 385/38; 385/90; 385/126; 385/131; 385/132; 437/51; 437/204; 437/206; 437/207; 437/209; 437/249; 264/1.1; 264/1.5; 264/1.7
[58] Field of Search ............... 385/14, 24, 28, 38, 385/49, 51, 52, 88, 89, 90, 91, 76, 123, 129, 130, 131, 132, 126, 128; 250/227.11; 264/1.1, 1.4, 1.5, 1.7, 2.7; 437/51, 204, 205, 206, 209, 249, 250, 207; 357/17, 19, 30, 40

[56] References Cited

U.S. PATENT DOCUMENTS

| | | |
|---|---|---|
| 4,836,645 | 6/1989 | Lefevre et al. ............... 385/49 X |
| 4,892,374 | 1/1990 | Ackerman et al. ............ 385/49 X |
| 5,006,906 | 4/1991 | Deri ........................... 385/14 X |
| 5,011,249 | 4/1991 | Diaz ........................... 385/14 X |
| 5,046,800 | 9/1991 | Blyler, Jr. et al. ............ 385/14 X |
| 5,053,357 | 10/1991 | Lin et al. .................... 437/204 |
| 5,054,870 | 10/1991 | Lösch et al. ................. 385/14 |
| 5,061,029 | 10/1991 | Ishikawa ..................... 385/14 X |
| 5,071,223 | 12/1991 | Gotoh et al. ................. 385/14 |
| 5,113,471 | 5/1992 | Inaishi et al. ................ 385/49 X |
| 5,123,066 | 6/1992 | Acarlar ........................ 385/14 |
| 5,179,601 | 1/1993 | Gotoh et al. ................. 385/14 |

*Primary Examiner*—Brian Healy
*Attorney, Agent, or Firm*—Eugene A. Parsons; Gary F. Witting

[57] ABSTRACT

A method for interconnecting a waveguide (102), an optoelectronic component 101, and an electronic component (103). A first surface (108) is formed from a portion of cladding region (107) and a second surface (109) is formed from a portion of core region and a portion of the cladding region. A substrate (104) having electrical tracings (212', 213') is attached to the waveguide (102) so that an electronic component receiving area (111') and an optoelectronic component area (112') are attached to the first and second surface (108, 109) of the waveguide (102) respectively. An electronic component (103) and an optoelectronic component (101) are mounted to the electronic component receiving area (111') and the optoelectronic receiving area (112') respectively.

17 Claims, 3 Drawing Sheets

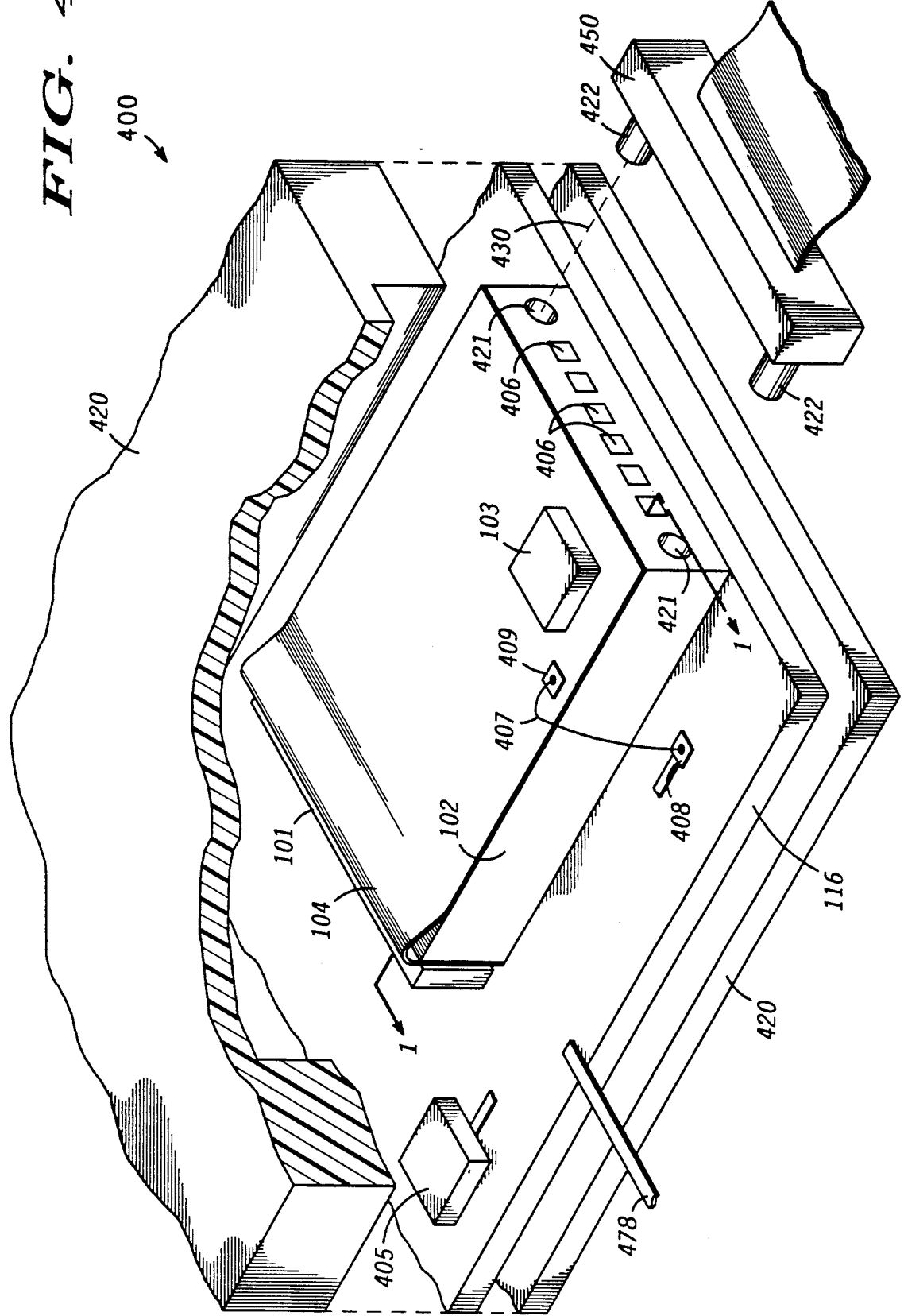

5,249,245

OPTOELECTROINC MOUNT INCLUDING FLEXIBLE SUBSTRATE AND METHOD FOR MAKING SAME

BACKGROUND OF THE INVENTION

This invention relates, in general, to fabrication of optical devices and, more particularly, to interconnecting optical devices and waveguides together.

This application is related to copending application that bears Ser. No. 07/889,335, pending, titled MOLDED WAVEGUIDE AND METHOD OF MAKING SAME, filed on May 28, 1992, which is hereby incorporated by reference herein.

At present, interconnection of an optical device and a waveguide is a difficult task that typically is achieved by use of hand methods or use of semiautomatic methods for interconnection or mating of the waveguide and the optical device. Generally, these methods are complex, inefficient, and not suitable for high volume manufacturing. However, a major problem associated with interconnection of optical devices to waveguides is a fabrication method and structure that will allow electrical and mechanical coupling between the optical device and the waveguide.

In the prior art, interconnection of the optical device and the waveguide typically is achieved by carefully aligning the optical device to the waveguide by hand, commonly called active alignment, and subsequently cementing or adhering the optical device to the waveguide. However, many problems arise by aligning the optical device and the waveguide by hand, such as being extremely labor intensive, costly, inaccuracy of alignment, and the like. Further, curing of the adhesive that binds the optical device and the waveguide together often results in a shifting of the alignment of the optical device to the waveguide, thus causing a potentially inefficient transfer of light from the optical device. Moreover, if the misalignment is severe enough, unusable product is manufactured, thus increasing cost and reducing manufacturing capability.

It can be readily seen that conventional methods for connecting an optical device to a waveguide have severe limitations. Also, it is evident that the conventional processes that are used to fabricate the interconnection between the optical device and the waveguide are not only complex and expensive, but also not amenable to high volume manufacturing. Therefore, a method for making an interconnection between an optical device and a waveguide is highly desirable.

SUMMARY OF THE INVENTION

Briefly stated, a method is provided that interconnects a waveguide, an optoelectronic component, and an electronic component. A waveguide having a plurality of core regions and a cladding region that surrounds the plurality of core regions is provided. A first surface is formed from a portion of the cladding region and a second surface is formed from a portion of the core region and a portion of the cladding region. An insulative flexible substrate with both an electronic component receiving area and an optoelectronic receiving area and having electrically conductive tracing thereon extending at least from the electronic component receiving area to the optoelectronic receiving area is provided. The insulative flexible substrate is attached to the waveguide so that the electronic component receiving area and the optoelectronic component area are attached to the first and second surface of the waveguide respectively. An electronic component and an optoelectronic component are mounted to the electronic component receiving area and the optoelectronic receiving area respectively.

BRIEF DESCRIPTION OF THE DRAWINGS

FIG. 4 is a greatly enlarged simplified exploded view of an optoelectronic mount on an interconnect board.

DETAILED DESCRIPTION OF THE DRAWINGS

Figure 1:
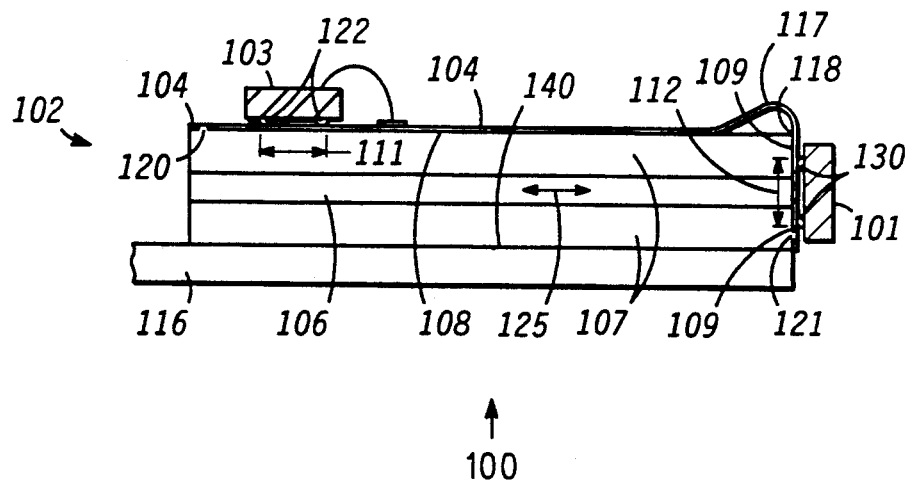
FIG. 1 is a greatly enlarged simplified cross-sectional view of an optoelectronic mount.

FIG. 1 is an enlarged simplified cross-sectional view of an optoelectronic mount 100 affixed to an interconnect board 116. It should be understood that FIG. 1 is a cross-sectional view as shown in FIG. 4 by arrows 1—1, through waveguide 102 and interconnect board 116. In the present invention a combination of processes is described that allows for accurate and efficient integration or interconnection of an optoelectronic component 101, a waveguide 102, electronic component 103, and insulative flexible substrate 104, thus fabricating optoelectronic mount 100.

Generally, waveguide 102 is fabricated with a plurality of core regions 406, as shown in FIG. 4, one of which is cross sectioned and illustrated as a core region 106, as shown in FIG. 1. Core region 106 is surrounded by cladding regions 107. Typically, both core region 106 and cladding regions 107 are made of a hard optically transparent polymer, wherein core region 106 has a higher refractive index than cladding regions 107, thus allowing for efficient light transmission through core region 106. Generally, there is a refractive index difference of at least 0.01 between core region 106 and cladding regions 107. In a preferred embodiment of the present invention, waveguide 102 is made in accordance with copending application previously mentioned hereinabove. However, it should be understood that other methods for making waveguide 102 are possible and are capable of being used in the present invention. Additionally, waveguide 102 is made in a manner that surface 108 is made from cladding regions 107 and a surface 109 is made from both an end of core region 106 and an end of core regions 107.

Figure 2:
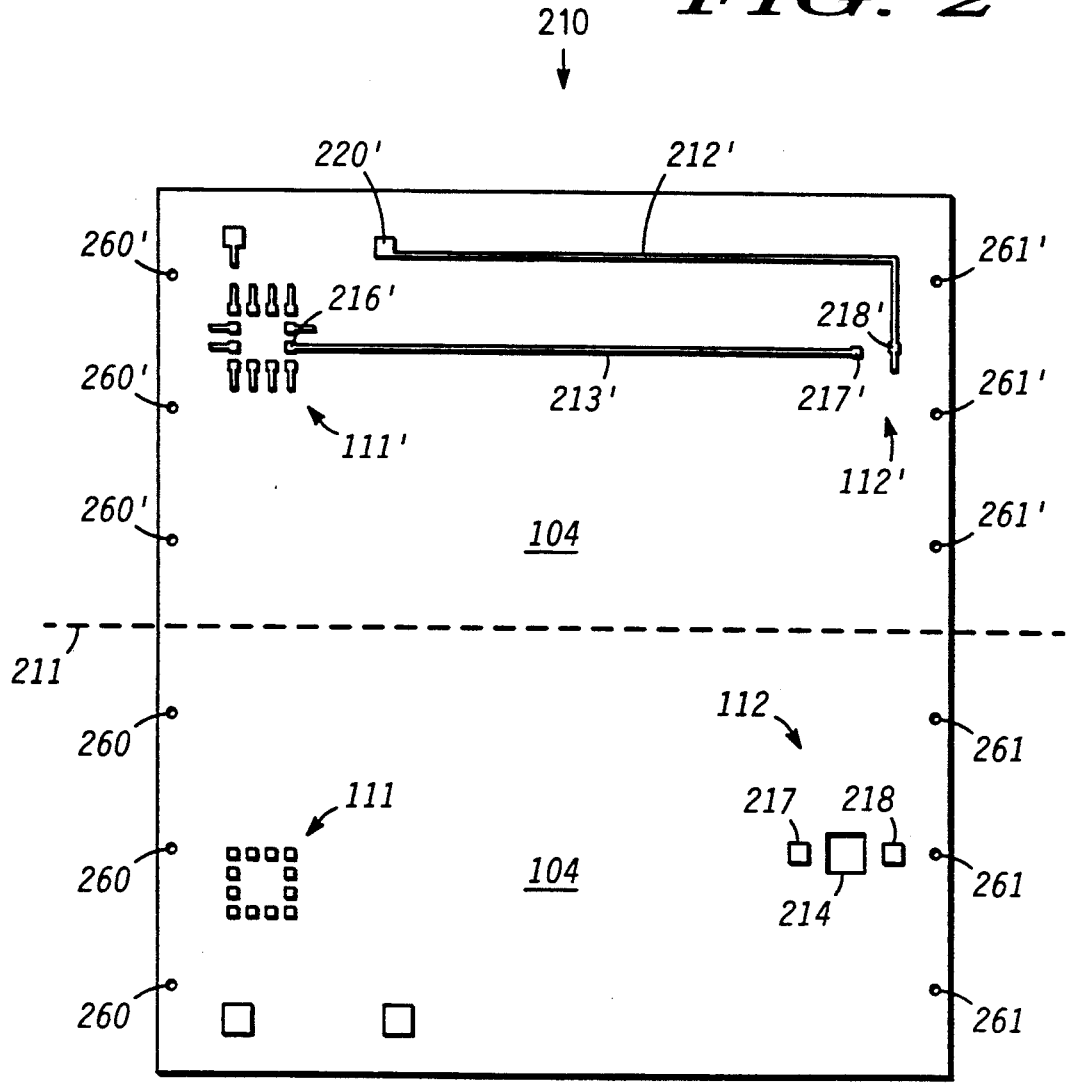
FIG. 2 is a greatly enlarged simplified plan view of an example of a layout of an insulative flexible substrate.

Substrate 104 having a plurality of electrically conductive traces which are illustrated by conductive traces 212' and 213', as shown in FIG. 2, is affixed to first surface 108 and second surface 109 so that electronic component receiving area 111 and optoelectronic receiving area 112 of substrate 104 are attached to surfaces 108 and 109, respectively.

Referring now to FIG. 2, an example is shown of a simplified illustration of a layout 210 for substrate 104. In the single FIG. 2, two versions of layout 210 are separated by dashed line 211 with a first version being made of a material that is not optically transparent and with the second version being made of an optically transparent material. The first version is indicated with plain numerals and the second version is indicated with a ' after the numerals. Further, both versions of substrate 104 have conductive traces 212' and 213' in similar locations; however, since the first version is made of nontransparent material, these conductive traces are not visible. Additionally, during actual manufacturing for large scale production of substrate 104 it is advantageous to make substrate 104 in one specific version. Moreover, it should be understood that FIG. 2 is not drawn to scale and that dimensions of illustrated feature can be varied to fit any specific application.

Substrate 104 is made from any thin insulative material, such as those typically suitable for tape automated bonding (TAB) backing layer or substrate. Polyimide is a representative material, but is certainly not the only one; polyimide may be found under trade names such as "UPLEX" or "KAPTON", among others. Other suitable materials include, but are not necessarily limited to polyester material (lower in cost and performance than polyimide), Mylar materials, and composites materials, such as a resin-filed epoxy or fiber reinforced materials. Substrate 104 bears a plurality of conductive traces, illustrated by conductive traces 212' and 213' thereon or therein which are formed by any suitable method, such as but not limited to plating, etching, photolithography, printing, etc. Typically, conductive traces 212' and 213' are made of a metal or metal alloy, such as copper, aluminum, tin, or titanium/tungsten (TiW), or the like. Adhesion of the plurality of conductive traces 212' and 213' to substrate 104 is such that conductive traces 212' and 213' will not delaminate or separate from substrate 104 when substrate 104 is bent or positioned on waveguide 102, as shown in FIG. 1. Further, materials selected for manufacturing of substrate 104 are temperature resistant. For example, selected materials are capable of tolerating temperatures used during an over molding process that typically ranges from 300.0 degrees Celsius to 200 degrees Celsius and from a time ranging from 15.0 minutes to 10.0 minutes. However, it should be evident that materials that exceed these requirements or performance levels are also usable. Purchase of substrate 104 that is properly configured and prefabricated to a specific application or design are available from several different manufactures one of which is Rodgers Corporation located in Arizona.

Electronic component receiving areas 111 and 111' are examples of either a plurality of electronic receiving areas that are capable of being located adjacent to each other that are located on substrate 104 or of a single electronic receiving area that is located on substrate 104. Generally, receiving areas 111 and 111' are made of a plurality bonding pads that are opened or cleared in substrate 104 for receiving electronic component 103, as shown in FIG. 1. Typically, these electronic receiving areas and associated bonding pads are located anywhere on that portion of substrate 104 that is in contact with surface 108 of waveguide 102, as shown in FIG. 1. Electrical interconnection between the plurality of bonding pads and electronic component 103 is achieved in any of several means, such as wire bonding, bump bonding, or the like. However, in a preferred embodiment of the present invention, bump bonding is used to interconnect electronic component 103 to the plurality of bonding pads of receiving areas 111 or 111' with bump balls 122, as shown in FIG. 1. Further, it should be understood that the plurality of bonding pads are capable of being electrically interconnected to interconnect board, as shown in FIG. 4, by means of wire bonding the plurality of bonding pads of electronic receiving area 111 and 111' directly to the interconnect board 116, as shown in FIG. 4.

Optoelectronic component receiving areas 112 and 112' are examples of either a plurality of optoelectronic receiving areas that are located on substrate 104 or of a single optoelectronic receiving area that is located distally from electronic component receiving areas 111 and 111' on substrate 104, thereby allowing optoelectronic receiving areas 112 and 112' to be able to be properly positioned and aligned to waveguide 102, as shown in FIG. 1. Generally, optoelectronic receiving areas 112 and 112' are made of bonding pads 217, 218 and 217', 218' that are opened or cleared in substrate 104 for receiving optoelectronic component 101, as shown in FIG. 1. Electrical interconnection between the plurality of bonding pads and optoelectronic component 101 is achieved in any of several means, such as tab bonding, bump bonding, or the like. In a preferred embodiment of the present invention, bump bonding is used, illustrated by bump balls 130 as shown in FIG. 1, to electromechanically join optoelectronic component 101 to optoelectronic receiving area 112 and 112'. In the first version of layout 210 on substrate 104, an opening or window 214 is cut into substrate 104, thus allowing a clear path for optical signals or light to pass through opening 214 of substrate 104. Alternatively, in the second version of layout 210 on substrate 104, there is no need for an opening to be made in substrate 104 because substrate 104 is optically transparent, thus allowing light signals to pass through substrate 104. In either version, light signals, illustrated by double headed arrow 125 as shown in FIG. 1, are capable of passing in either direction through substrate 104.

Generally, design of layout 210 interconnects at least electronic component receiving areas 111 and 111' to optoelectronic component receiving areas 112 and 112' respectively. This minimal interconnection is illustrated by conductive trace 213' that extends from bonding pad 216' of electronic component receiving area 111' to bonding pad 217' of optoelectronic receiving area 112', thus interconnecting electronic component receiving area 111' with optoelectronic receiving area 112'. Additionally, conductive trace 212' illustrates a grounding trace that extends from bonding pad 218' of optoelectronic receiving area 112' to bonding pad 220'. Actual dimensions of both conductive traces 212' and 213' are application specific, thus depending upon the specific application the dimension are capable of being vastly different from that illustrated in FIG. 2. For example, if high speed signals (greater than 200 MBPS) are passing through traces 212' and 213' sizing of both 212' and 213' are increased. Generally, bonding pad 220' provides an electrically conductive pad that is capable of being electrically coupled to a ground source. Typically, grounding is achieved by wire bonding pad 220' to the grounding source on an interconnect board 116 (similar wire bonding is shown in FIG. 4).

Accurate placement of substrate 104 on to waveguide 102 is achieved by aligning substrate 104 in relation to waveguide 102. Typically, this alignment is accomplished by use of robotically controlled systems that use machine vision. The machine vision is further augmented by alignment fiducials or alignment features. Use of several different alignment fiducials and procedures, such as optical targets, positional orientation, and openings and tabs are capable of achieving accurate placement of substrate 104 to waveguide 102. By way of example, alignment openings 260, 260'and 261 and 261' are made in substrate 104 so as to facilitate alignment of substrate 104 to waveguide 102, as shown in FIG. 1. In a preferred embodiment of the present invention, openings 260, 260', 261, and 261' are photolithographically defined and subsequently etched through substrate 104, thus achieving accurate and repeatable placement of openings 260, 260', 261, and 261' in substrate 104. However, other methods for making openings 260, 260', 261, and 261' are capable of being used, such as machining, punching, and the like.

Referring back to FIG. 1, affixing of substrate 104 to waveguide 102 is achieved by using any suitable adhesive, such as an epoxy, polyimide, or any ultraviolet curable adhesive. Typically, substrate 104 is affixed to waveguide 102 by robotic control utilizing machine vision. For example only, waveguide 102 is held either by a jig on a table or held by a robotic arm (not shown). An optically transparent epoxy is applied to surfaces 108 and 109 of waveguide 102. Subsequently, substrate 104 is applied to waveguide 102 by a robotic arm. Placement of substrate 104 is aligned to waveguide 102 by using any one of several alignment fiducial systems. For example, tabs 120 and 121 are fabricated on or into surfaces 108 and 109 of waveguide 102. Tabs 120 and 121 are recognized by the machine vision system which orients openings 260, 260', 261, and 261', as shown in FIG. 2 in substrate 104 to tabs 120 and 121, respectively, on waveguide 102. Substrate 104 subsequently is placed on the waveguide 102 so that tabs 120 and 121 mate with openings 260, 260', 261, and 261', respectively, thus aligning substrate 104 to waveguide 102. Generally, alignment tolerances that are achievable by using this method are within 1.0 micron or less, thus more than adequately placing or aligning substrate 104 in relation to waveguide 102. However, a more precise alignment of substrate 104 in relation to waveguide 102 is possible by using an optical alignment system that aligns two fiducials or overlays these fiducials on top of each other. More specifically, at least two alignment fiducials are placed on both substrate 104 and waveguide 102. A machine vision system subsequently visualizes and recognizes the two fiducials and overlays the fiducials, thus aligning substrate 104 and waveguide 102 to a tolerance of approximately 0.5 micron.

Typically, affixing of substrate 104 to waveguide 102 forms a small loop 117 as substrate 104 turns corner 118 and is affixed to surface 109. Loop 117 provides substrate 104 with a gentle bend so as not to allow a point stress on electrical traces (not shown) that bend around corner 118, thus providing electrical accessibility around corner 118 that is a production worthy process. Sizing of loop 117 is application specific and is dependent upon rigidity of substrate 104, as well as rigidity of the electrical traces (not shown) contained therein or thereon. Alternatively, making corner 118 into a curved surface with an appropriate arc allows substrate 104 to be curved around corner 118 with no apparent point stress applied to substrate 104.

Figure 3:
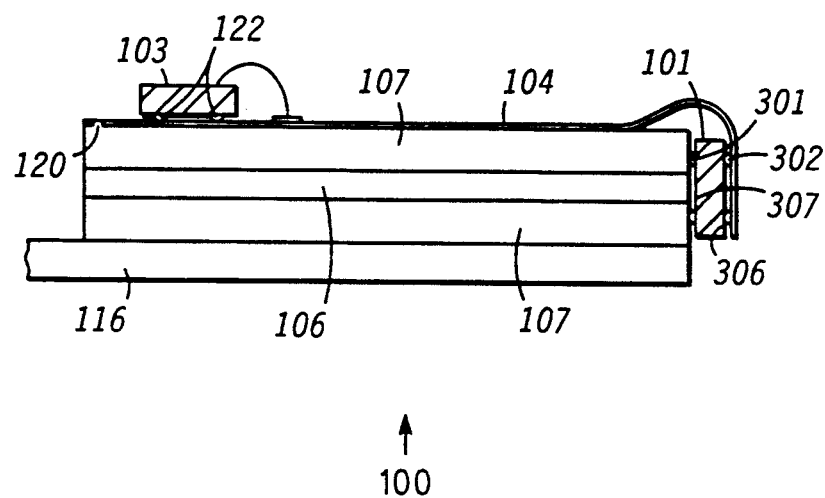
FIG. 3 is a greatly enlarged simplified cross-sectional view of another optoelectronic mount.

Both electrical component 103 and optoelectronic component 101 typically are placed by use of automated manufacturing systems. More specially, components 103 and 101 are placed with robotic arms, thus streamlining manufacturing with increased precision and cost effectiveness. FIG. 3 is a greatly enlarged simplified cross-sectional view of optoelectronic mount 100. However, in this embodiment, optoelectronic component 101 is affixed or bonded directly to waveguide 102 by adhesive bumps 301 and substrate 104 is electromechancially affixed to optoelectronic component 101 by solder bumps 302. Typically, bumps 301 are made of an adhesive, such as an epoxy, a UV curable epoxy, a polyimide, or the like. Electrical interconnection between optoelectronic component 101 and substrate 104 is achieved by solder bumps 302 which electrically and mechanically affix substrate 104 to optoelectronic component 101. Further, it should be understood that when optoelectronic component 101 is a laser such as a vertical cavity surface emitting laser (VCSEL) light emission is capable of passing through either surfaces 306 or 307 depending upon the VCSEL design and configuration.

FIG. 4 is a simplified partially exploded pictorial view of an optical electronic module 400. In the present invention optoelectronic component 101, waveguide 102, and standard electronic components 405 and 103 are electrically coupled to an interconnect board 116.

Waveguide 102 is capable of being interconnected with individual optical components, for example an optical transmitter such as a laser or a light emitting diode (LED) (not shown) or an optical receiver or photodetector such as a photodiode (not shown), or a combination of both photo transmitters and photodetectors. Alternatively, optoelectronic component 101 is an array mounted on waveguide 102 which contains a variety of optical components. The optical components are mounted to waveguide 102 in such a manner that individual working portions of the optical components are aligned to core regions 406 of waveguide 102, thus providing maximum light transmission through individual core regions of waveguide 102. As shown in FIGS. 1 and 3, array 101 is mounted to substrate 104 by solder bump balls 130 or 302, respectively. By accurately placing and solder bumping array 101 to waveguide 102, light transmission from the working portions of array 101 through core regions 406 of waveguide 102 is maximized, thus maximizing signal efficacy.

Generally, waveguide 102 with attached optical components is attached to interconnect board 116 by any one of several methods, such as adhering, press fitting, molding or the like. However, in a preferred embodiment of the present invention, an epoxy adhesive is applied to interconnect board 116 at an approximate location where the waveguide 102 and the interconnect board 116 are to be bonded. Waveguide 102 is placed onto the adhesive by an automated system such as a robot arm (not shown), thereby providing accurate placement and orientation of waveguide 102.

Subsequent electrical coupling of standard electrical components, as illustrated by integrated circuit 405, on interconnect board 116 to the optical components is achieved by a wire bond 407 from bonding pad 408 of interconnect board 116 to bonding pad 409 on substrate 104. Bonding pad 409 is either electrically connected or coupled to either array 101 or electrically connected to other components on substrate 104 such as electronic component 103. It should be evident by one skilled in the art, that many more electrical couplings typically are necessary to fully utilize inputs and outputs of both the standard electrical components and the optical components. It should be further evident that standard output and input means, represented by lead 478, are used to couple other electrical components to interconnection board 116 as well.

Further, plastic encapsulation of interconnect board 116 and waveguide 102 typically is achieved by an over-molding process, represented by plastic pieces 420, which encapsulates interconnect board 116 and waveguide 102 while leaving alignment ferrules 421 open and clear of debris. Alignment ferrules 421 are then engaged, represented by dotted lines 430, by alignment pins 422 of optical fiber cable 450, thereby providing accurate and repeatable alignment of the plurality of core regions 406 of waveguide 102 to optical fiber ribbon cable 450.

By now it should be appreciated that a novel method for interconnecting a waveguide, standard electronic components, and optoelectronic components to form a module have been described. The method and article of the present invention allow for integration of optoelectronic components to standard electronic components in a cost efficient manner by providing a way to eliminate costly steps carried out by hand and to automate the remaining manufacturing steps.

We claim:

1. A method for manufacturing an optoelectronic mount that interconnects a waveguide, an optoelectronic component, and an electronic component comprising, the steps of:
   providing a waveguide having a plurality of core regions that are surrounded by cladding regions, wherein a portion of the cladding regions forms a first surface and a portion of the plurality of core regions and the cladding regions forms a second surface;
   providing an insulative flexible substrate, where the substrate has an electronic component receiving area and an optoelectronic receiving area thereon, and where the substrate additionally has a plurality of electrically conductive tracings thereon extending at least from the electronic component receiving area to the optoelectronic receiving area;
   affixing the insulative flexible substrate having the electronic component receiving area to the first surface and further affixing the flexible substrate having the optoelectronic receiving area to the second surface of the waveguide; and
   mounting an electronic component to the electronic component receiving area and mounting an optoelectronic component to the optoelectronic receiving area, thereby interconnecting the electronic component, the optoelectronic component, and the waveguide so as to make an optical mount.

2. A method for manufacturing an optoelectronic mount as claimed in claim 1 further including the step of affixing the optical mount to an interconnect board.

3. A method for manufacturing an optoelectronic mount as claimed in claim 2 further including the step of electrically coupling the optical mount to the interconnect board.

4. A method for manufacturing an optoelectronic mount as claimed in claim 1, prior to the step of affixing the insulative flexible substrate, further including the step of aligning the insulative flexible substrate to the waveguide by use of alignment fiducials, thereby accurately placing the insulative flexible substrate to the waveguide.

5. A method for manufacturing an optoelectronic mount as claimed in claim 1 wherein the providing of the waveguide is accomplished by providing a molded waveguide.

6. A method for manufacturing an optoelectronic mount as claimed in claim 1 wherein the affixing of the insulative flexible substrate is achieved by affixing the flexible insulative substrate to the first surface with an adhesive that is ultraviolet light curable.

7. A method for manufacturing an optoelectronic mount as claimed in claim 1 wherein the mounting of the optoelectronic component is achieved with an array of optoelectronic components.

8. A method for interconnecting an optical waveguide to an optoelectronic device comprising, the steps of:
   providing an optical waveguide having a plurality of core regions and having a cladding region that surrounds the plurality of core regions, where a portion of the cladding region forms a first surface and an end of the plurality of core regions and second portion of the cladding region forms a second surface;
   providing an insulative flexible substrate, where the substrate has an electronic component receiving area and an optoelectronic receiving area thereon, and where the substrate additionally has a plurality of electrically conductive tracings thereon extending at least from the electronic component receiving area to the optoelectronic receiving area;
   aligning the insulative flexible substrate to the first surface and second surface in an aligned position;
   attaching the insulative flexible substrate to the first surface and to the second surface of the waveguide in the aligned position;
   providing an optoelectronic device with a working portion;
   aligning the optoelectronic device to a portion of the plurality of core regions of the waveguide, thereby centering the working portion of the optoelectronic device to a core region of the waveguide; and
   attaching the optoelectronic device electrically to the electrically conductive tracings of the flexible substrate, thereby creating an interconnection between the optical waveguide and the optoelectronic device.

9. A method for interconnecting an optical waveguide to an optoelectronic device as claimed in claim further comprising the steps of:
   providing an electronic component; and
   mounting the electronic component to the electronic component receiving area.

10. A method for interconnecting an optical waveguide to an optoelectronic device as claimed in claim 8 wherein the aligning of the insulative flexible substrate is accomplished by use of alignment fiducials.

11. A method for interconnecting an optical waveguide to an optoelectronic device as claimed in claim 10 wherein the alignment fiducials are tabs.

12. A method for interconnecting an optical waveguide to an optoelectronic device as claimed in claim 11 wherein the alignment fiducials are optical fiducials.

13. A method for interconnecting an optical waveguide to an optoelectronic device as claimed in claim 8 wherein the mounting of the optoelectronic component is achieved with an array of optoelectronic components.

14. An optoelectronic mount that interconnects a waveguide, an optoelectronic component, and an electronic component comprising:
   a waveguide having a plurality of core regions that are surrounded by cladding regions, wherein a portion of the cladding regions forms a first surface and a portion of the plurality of core regions and the cladding regions forms a second surface;

an insulative flexible substrate, where the substrate has an electronic component receiving area and an optoelectronic receiving area thereon, and where the substrate additionally has a plurality of electrically conductive tracings thereon extending at least from the electronic component receiving area to the optoelectronic receiving area;

means for attaching the insulative flexible substrate to the waveguide so that the electronic component receiving area attaches to the first surface and the optoelectronic receiving area attaches to the second surface; and an electronic component having electrical contacts mounted to the electronic component receiving area with the electrical contacts connected to the electrically conductive tracings and an optoelectronic device having electrical contacts mounted to the optoelectronic receiving area with the electronic contacts connected to the electrically conductive tracings, thus interconnecting the electronic component, the optoelectronic component and the waveguide.

15. An optoelectronic mount that interconnects a waveguide, an optoelectronic component, and an electronic component as claimed in claim 14 wherein the insulative flexible substrate is optically transparent.

16. An optoelectronic mount that interconnects a waveguide, an optoelectronic component, and an electronic component as claimed in claim 14 wherein the optoelectronic device mounted to the optoelectronic receiving area is an optoelectronic array.

17. An optical module comprising:

an optical mount including a waveguide, a flexible substrate affixed to the waveguide, and a optoelectronic component affixed to the flexible substrate, wherein the waveguide includes a plurality of core regions that are surrounded by cladding regions and that a portion of the cladding regions forms a first surface and a portion of the plurality of core regions and the cladding regions forms a second surface, wherein the flexible substrate includes a plurality of bonding pads defining a first area and a plurality of bonding pads defining a second area thereon, and where the substrate additionally has a plurality of electrically conductive tracings thereon extending at least from the first area to the second area thereon and where the substrate is affixed to the waveguide so that the first area is affixed to the first surface and the second area is affixed to the second surface, and wherein the optoelectronic component is affixed to the second area of the substrate;

an interconnect board having at least one lead and affixed to the optical mount and where the optical mount and the interconnect board are electrically connected to at least one conductive tracing on the substrate; and an over molding structure encapsulating the optical mount and interconnect board, thereby fabricating an optical module.

* * * * *

UNITED STATES PATENT AND TRADEMARK OFFICE
CERTIFICATE OF CORRECTION

PATENT NO. : 5,249,245
DATED : September 28, 1993
INVENTOR(S) : Lebby et al

It is certified that error appears in the above-indentified patent and that said Letters Patent is hereby corrected as shown below:

Column 8, claim 9, line 40, insert "8" following the word "claim".

Signed and Sealed this

Fourth Day of October, 1994

BRUCE LEHMAN

Attest:

Attesting Officer         Commissioner of Patents and Trademarks